United States Patent
Kim et al.

(10) Patent No.: US 8,846,418 B2
(45) Date of Patent: Sep. 30, 2014

(54) METHOD OF MANUFACTURING QUANTUM DOT LAYER AND QUANTUM DOT OPTOELECTRONIC DEVICE INCLUDING THE QUANTUM DOT LAYER

(75) Inventors: Tae-ho Kim, Suwon-si (KR); Kyung-sang Cho, Gwacheon-si (KR); Dae-young Chung, Yongin-si (KR); Byoung-lyong Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 51 days.

(21) Appl. No.: 13/482,274

(22) Filed: May 29, 2012

(65) Prior Publication Data
US 2013/0056705 A1     Mar. 7, 2013

(30) Foreign Application Priority Data
Sep. 6, 2011 (KR) ........................ 10-2011-0090313

(51) Int. Cl.
| | | |
|---|---|---|
| *H01L 47/02* | (2006.01) | |
| *G03F 7/00* | (2006.01) | |
| *B82Y 20/00* | (2011.01) | |
| *B82Y 30/00* | (2011.01) | |

(52) U.S. Cl.
CPC ............ *B82Y 20/00* (2013.01); *Y02E 10/549* (2013.01); *G03F 7/00* (2013.01); *B82Y 30/00* (2013.01)
USPC ................................. 438/7; 438/48

(58) Field of Classification Search
USPC ....................................... 438/7, 48
See application file for complete search history.

(56) References Cited

U.S. PATENT DOCUMENTS

| | | |
|---|---|---|
| 2006/0027799 A1 | 2/2006 | Kobayashi et al. |
| 2010/0143726 A1 | 6/2010 | Gölzhäuser et al. |
| 2010/0330715 A1 | 12/2010 | Gopal et al. |

FOREIGN PATENT DOCUMENTS

KR    10-2010-0093858 A    8/2010

OTHER PUBLICATIONS

Tae-Ho Kim et al: "Full-colour quantum dot displays fabricated by transfer printing", Nature Photonics, vol. 5, No. 3, Feb. 20, 2011, pp. 176-182, XP055083899 ISSN: 1749-4885, DOI: 10.1038/nphoton.2011.12.
Gopal Ashwini et al: "Quantum dots light emitting devices on MEMS: microcontact printing, near-field imaging, and early cancer detection", International Symposium on Photoelectronic Detection and Imaging 2011: Sensor and Micromachined Optical Device Technologies, SPIE, 1000 20th St. Bellingham WA 98225-6705 USA, vol. 8191, No. 1, Jun. 9, 2011, pp. 1-10, XP060018195 DOI: 10.1117/12.901089.
Communication from the European Patent Office issued Oct. 29, 2013 in counterpart European Application No. 12181377.8.

*Primary Examiner* — Samuel Gebremariam
(74) *Attorney, Agent, or Firm* — Sughrue Mion, PLLC (57) ABSTRACT

A method of manufacturing a quantum dot layer, and a quantum dot optoelectronic device including the quantum dot layer. The method includes sequentially stacking a self-assembled monolayer, a sacrificial layer, and a quantum dot layer on a source substrate; disposing a stamp on the quantum dot layer; picking up the sacrificial layer, the quantum dot layer and the stamp; and removing the sacrificial layer from the quantum dot layer using a solution that dissolves the sacrificial layer.

24 Claims, 9 Drawing Sheets

METHOD OF MANUFACTURING QUANTUM DOT LAYER AND QUANTUM DOT OPTOELECTRONIC DEVICE INCLUDING THE QUANTUM DOT LAYER

CROSS-REFERENCE TO RELATED APPLICATION

This application claims the benefit of Korean Patent Application No. 10-2011-0090313, filed on Sep. 6, 2011, in the Korean Intellectual Property Office, the disclosure of which are incorporated herein in its entirety by reference.

BACKGROUND

1. Field

The present disclosure relates to a method of manufacturing a quantum dot layer, and a quantum dot optoelectronic device including the quantum dot layer.

2. Description of the Related Art

Recently, research into an optoelectronic device using an emission characteristic of a quantum dot (QD) is being widely conducted.

A quantum dot is a semiconductor material having a crystallization structure having a size smaller than an exciton bohr radius, that is, a size of several nanometers. Although the quantum dot has many electrons, the number of free electrons is limited to a range of from about one to about one hundred. In this case, an electrons' energy level is discontinuously limited, and thus the quantum dot shows electrical and optical characteristics different from those of a semiconductor in a bulk state which forms a continuous band. In the quantum dot, the energy level varies according to the size of the quantum dot, and thus the bandgap may be controlled by changing the quantum dot's size. That is, the quantum dot may control the emission wavelength only by changing its size.

A quantum dot may be used in an optoelectronic device because of its advantages. For example, the quantum dot has high color purity, self-emission characteristics, easy color adjustability via size adjustment, and the like.

When a quantum dot layer is manufactured through a solution process such as spin coating, a large area quantum dot layer may be manufactured under the influence of an air shear force. However, since it is difficult to transfer the manufactured quantum dot layer to an optoelectronic device or to stack the quantum dot layer in a multi-layered structure using existing technology, there are many limitations on using a quantum dot layer having excellent properties in the optoelectronic device.

SUMMARY

One or more embodiments provide a method of manufacturing a quantum dot layer using a sacrificial layer, and a quantum dot optoelectronic device including the quantum dot layer.

According to an aspect of an embodiment, there is provided a method of manufacturing a quantum dot layer, the method including sequentially stacking a self-assembled monolayer (SAM), a sacrificial layer, and a quantum dot layer on a source substrate; disposing a stamp on the quantum dot layer; picking up the sacrificial layer, the quantum dot layer and the stamp; and removing the sacrificial layer from the quantum dot layer using a solution that dissolves the sacrificial layer.

The quantum dot layer may be formed on the sacrificial layer through a solution process.

The sacrificial layer may be a polymer-based high molecular weight material.

The solution may be a polarizable solution.

The quantum dot layer may include a plurality of quantum dots arranged in a two-dimensional array.

When the sacrificial layer and the quantum dot layer are picked up, the sacrificial layer may be separated from the SAM.

The stamp may be an elastomeric polymer.

An ultra-violet (UV)-ozone treatment may be performed on the stamp.

Micro patterns may be formed on a surface of the stamp contacting the quantum dot layer so as to decrease the contact area between the quantum dot layer and the stamp.

The method may further include forming the quantum dot layer on the device substrate by transfer-printing the quantum dot layer from which the sacrificial layer is removed onto a device substrate.

The method may further include separating the stamp from the quantum dot layer using at least one of heat, a piezoelectric effect, and micro-vibration such as acoustic waves.

According to an aspect of another embodiment, there is provided a quantum dot optoelectronic device including a first electrode and a second electrode that are disposed spaced apart from each other; and a quantum dot active layer disposed between the first electrode and the second electrode and including a quantum dot layer manufactured using the method described above.

The quantum dot layer may include a plurality of quantum dots each having a size capable of emitting light of a same wavelength band.

The quantum dot active layer may include a plurality of quantum dot layers emitting light of different colors.

The quantum dot active layer may have a multi-layered structure in which a plurality of quantum dot layers are vertically stacked.

The quantum dot active layer may emit white light.

The quantum dot active layer may have a single-layer structure in which a plurality of active layers are horizontally disposed.

The plurality of quantum dot layers may be disposed spaced apart from one another.

BRIEF DESCRIPTION OF THE DRAWINGS

The above and/or other aspects will become apparent and more readily appreciated from the following description of the embodiments, taken in conjunction with the accompanying drawings of which:

FIG. 9 is a view illustrating a quantum dot optoelectronic device manufactured using a method of manufacturing a quantum dot layer, according to an embodiment, wherein FIG. 9 shows a quantum dot display;

FIG. 10 is a view illustrating a quantum dot optoelectronic device manufactured using a method of manufacturing a quantum dot layer, according to another embodiment, wherein FIG. 10 shows a white emission quantum dot optoelectronic device;

DETAILED DESCRIPTION

Exemplary embodiments will be described in detail with reference to the accompanying drawings. In the drawings, the thicknesses of layers and regions are exaggerated for clarity. Like reference numerals denote like elements throughout the specification.

Figure 1:
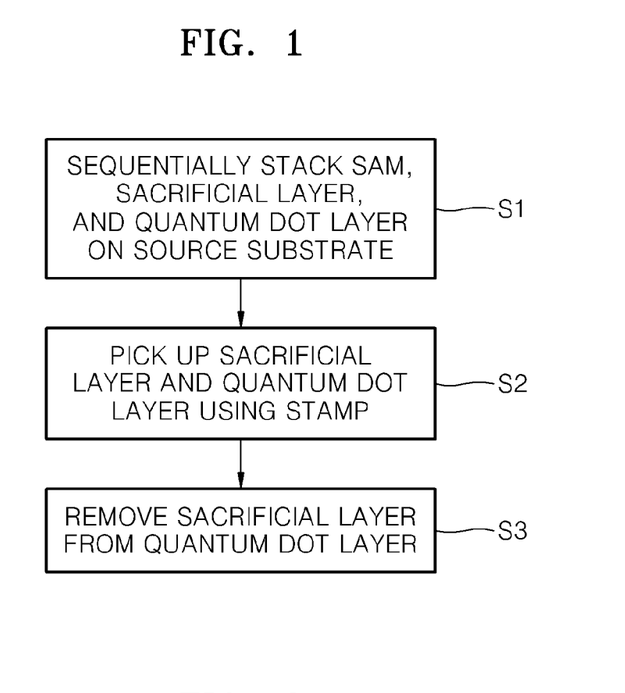
FIG. 1 is a flowchart illustrating a method of manufacturing a quantum dot layer, according to an embodiment.

FIG. 1 is a flowchart illustrating a method of manufacturing a quantum dot layer, according to an embodiment.

Referring to FIG. 1, a self-assembled monolayer (SAM), a sacrificial layer and a quantum dot layer are sequentially stacked on a source substrate 10 (S1). A surface treatment for forming, for example, the SAM, may be performed on the source substrate 10 in advance so as to facilitate delamination of the sacrificial layer before forming the sacrificial layer. In this regard, a material used to perform the surface treatment on the SAM may be a material for silanizing or fluorinating a surface of the source substrate 10. For example, a surface treatment may be performed on a silicon substrate through solution dipping or thermal treatment using octadecyltrichlorosilane, octyltrichlorosilane, or trichloro(1H,1H,2H,2H-perfluorooctyl)silane and a derivative of the self-assembled material. In this case, the surface energy of the source substrate 10 may be greatly decreased, thereby facilitating delamination of the sacrificial layer.

The sacrificial layer formed on the SAM may be a polymer-based material that may be easily generated/removed even at a low temperature, for example, in a temperature range of room temperature to 120 degrees Celsius. The sacrificial layer may be formed of a material, for example, polyethylene oxide (PEO), polyvinyl alcohol (PVAL), poly amic acid (PAA), polyvinylpyrrolidone (PVP), or polyvinylmethylether (PVME) (for example, alkyl- and peroxyl-type macroradicals) which is soluble in a polarizable solution. Also, the molecular weight of a polymer used for forming the sacrificial layer may be in the range of from about 10,000 to about 500,000 g/mol.

Then, a quantum dot layer may be formed on the sacrificial layer. The quantum dot layer may be formed on the sacrificial layer through a solution process. The quantum dot may be a Group II-IV quantum dot, a Group III-IV quantum dot, a Group V quantum dot, or a compound thereof. The quantum dot may include at least one selected from the group consisting of CdS, CdSe, CdTe, ZnS, ZnSe, ZnTe, HgS, HgSe, HgTe, GaN, GaP, GaAs, InP and InAs, but is not limited thereto. Under different conditions, the quantum dot may include a compound including two or more materials selected from the group consisting of the above-stated materials. For example, the compound may be a quantum dot compound including two or more quantum dots existing in a simply-mixed state, a mixed crystal in which two or more compound crystals are partially divided in the same crystal such as a crystal having a core-shell structure or a gradient structure, or a compound including two or more nanocrystals. For example, the quantum dot may have a core structure in which holes may escape to the outside or a core/shell structure including a core and a shell covering the core.

The core may include at least one material selected from the group consisting of CdSe, CdS, ZnS, ZnSe, CdTe, CdSeTe, CdZnS, PbSe, AgInZnS, and ZnO, but is not limited thereto. The shell may include at least one material selected from the group consisting of CdSe, ZnSe, ZnS, ZnTe, CdTe, PbS, TiO, SrSe, and HgSe, but embodiments are not limited thereto.

The quantum dot may be manufactured using a quantum dot synthesizing method which is well known in the art. For example, the quantum dot according to the present embodiment may include all quantum dots manufactured by a chemical wet method using a metallic precursor. Also, the quantum dot may be manufactured using the method of injecting a predetermined metallic precursor into an organic solution included in a dispersant when necessary and growing the metallic precursor at a constant temperature, but embodiments are not limited thereto. When manufacturing the quantum dot, a size of the quantum dot may be adjusted to absorb or emit light of red (R), green (G), and blue (B) wavelengths.

The quantum dot may be coated on the sacrificial layer through a solution process, for example, by spin coating, deep coating, or spray coating, thereby forming a quantum dot layer. The quantum dot layer may be referred to as a quantum dot monolayer in which a plurality of quantum dots are arranged in a two-dimensional array. However, embodiments are not limited thereto, and the plurality of quantum dots may be arranged in a three-dimensional array.

A stamp may be disposed on the quantum dot layer, and the stamp picks up the sacrificial layer and the quantum dot layer through transfer printing (S2). In this regard, the SAM formed on the source substrate 10 is coupled to the source substrate 10 by a covalent bond and functions to extremely reduce the surface energy. Thus, if the stamp picks up the sacrificial layer, the SAM and the sacrificial layer are separated from each other. Consequently, only the quantum dot and the sacrificial layer are transferred to the stamp.

Then, the sacrificial layer may be immersed in a polarizable solution such as water or alcohol to remove the sacrificial layer from the quantum dot layer (S3). In the quantum dot layer, an inorganic nanocrystal may be encapsulated by an organic ligand, and an organic capping layer is formed of an insulating material. On the other hand, the sacrificial layer is formed of a high molecular material which is soluble in a polarizable solution such as water or alcohol. Accordingly, even during the process of dissolving the sacrificial layer in the polarizable solution, the properties of the quantum dot layer do not change.

The above-described quantum dot layer may be used as an active layer of an optoelectronic device such as a solar device or an emission device. Hereinafter, a method of stacking the quantum dot layer on a device substrate will be described.

FIGS. 2 to 8 are schematic views sequentially illustrating a method of manufacturing and transfer-printing a quantum dot layer, according to an embodiment.

Figure 2:
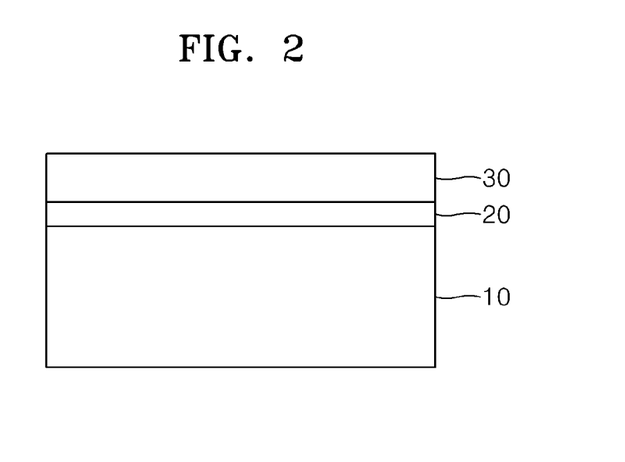
FIGS. 2 to 8 are schematic views sequentially illustrating a method of manufacturing a quantum dot layer, according to an embodiment.

Referring to FIG. 2, a SAM 20 and a sacrificial layer 30 are sequentially formed on a source substrate 10. In this regard, the material for forming the SAM 20 may be a material for silanizing or fluorinating a surface of the source substrate 10. The sacrificial layer 30 may be a polymer-based material that may be easily generated/removed even at a low temperature, for example, in a range of room temperature to 120 degrees Celsius. Also, the sacrificial layer 30 may be formed of a material which is soluble in a polarizable solution such as water.

Figure 3:
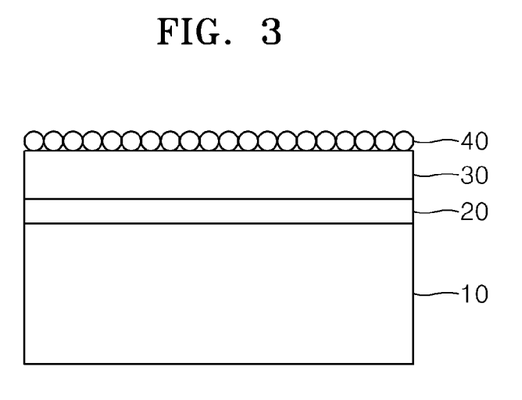

As illustrated in FIG. 3, a quantum dot layer 40 is formed on the sacrificial layer 30 through, for example, a solution process. The quantum dot layer 40 may be formed by, for example, spin coating. The quantum dot layer 40 may be a quantum dot monolayer in which a plurality of quantum dots are arranged in a two-dimensional array.

Figure 4:
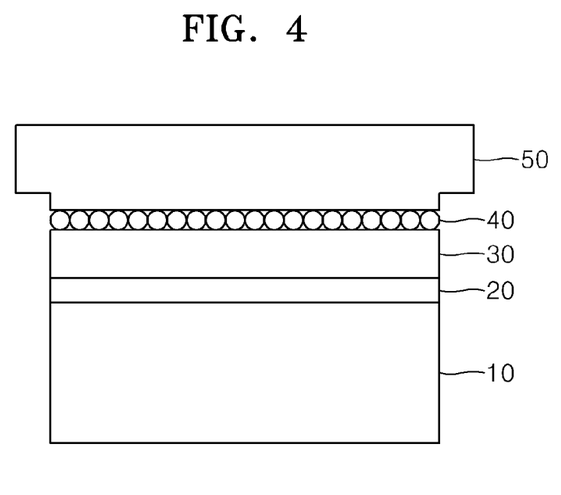

The quantum dot layer 40 is formed on the sacrificial layer 30, and then a stamp 50, for example, an elastomeric stamp, is disposed on the quantum dot layer 40 as illustrated in FIG. 4. Then, the stamp 50 picks up the quantum dot layer 40 using a protruding portion of the stamp 50. The stamp 50 may be a siloxane-based, an acryl-based, or an epoxy-based elastic material or a composite thereof, or may be formed by mixing reinforced materials and adjusting an intensity of the materials. The stamp 50 may include, for example, soft-PDMS, hard-PDMS, polyurethaneacrylate, and the like, or may be an elastomeric polymer.

In addition, a surface of the stamp 50 contacting the quantum dot layer 40 may be flat and may include a micro pattern. The stamp 50 may be manufactured to include the micro pattern. For example, a mold of a desired pattern may be formed on a silicon wafer via photolithography using an SU8 (SU-8 photoresist) which is a negative photoresist (PR), and then a liquid high molecular weight material may be poured and cured on the mold, thereby completing a patterned elastomer. Before pouring the liquid high molecular weight material, a surface treatment such as silanization or fluorination may be performed on the mold so as to easily separate the liquid high molecular material form the mold after performing the curing. The patterned elastomer is separated from the silicon wafer and then is cut to an appropriate size so as to be used as the patterned stamp. The patterned stamp 50 may easily pick up the quantum dot layer 40.

If the patterned stamp 50 is used, the physical stress applied to the quantum dot layer 40, pressed to be picked up by the stamp 50, may be reduced, and also the pattern stamp 50 may closely contact the quantum dot layer 40, thereby easily picking up the quantum dot layer 40. Also, an ultra-violet (UV)-ozone treatment may be performed on the stamp 50 so as to easily pick up the quantum dot layer 40. By performing the UV-ozone treatment, the surface energy of the stamp 50 is increased, thereby allowing it to more easily pick up the quantum dot layer 40.

Figure 5:
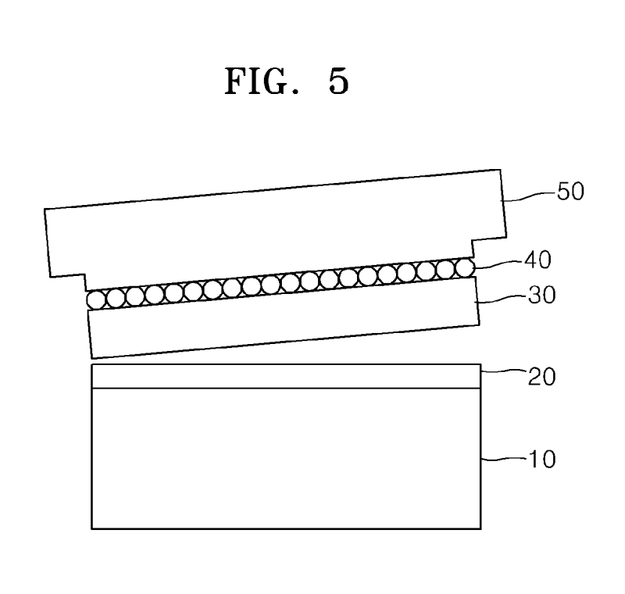

As illustrated in FIG. 5, the quantum dot layer 40 contacting a protruding portion of the stamp 50 is picked up by the stamp 50. Then, when the quantum dot layer 40 is picked up, the sacrificial layer 30 is separated from the source substrate 10 and the SAM layer 20 to be picked up together with the quantum dot layer 40.

Figure 6:
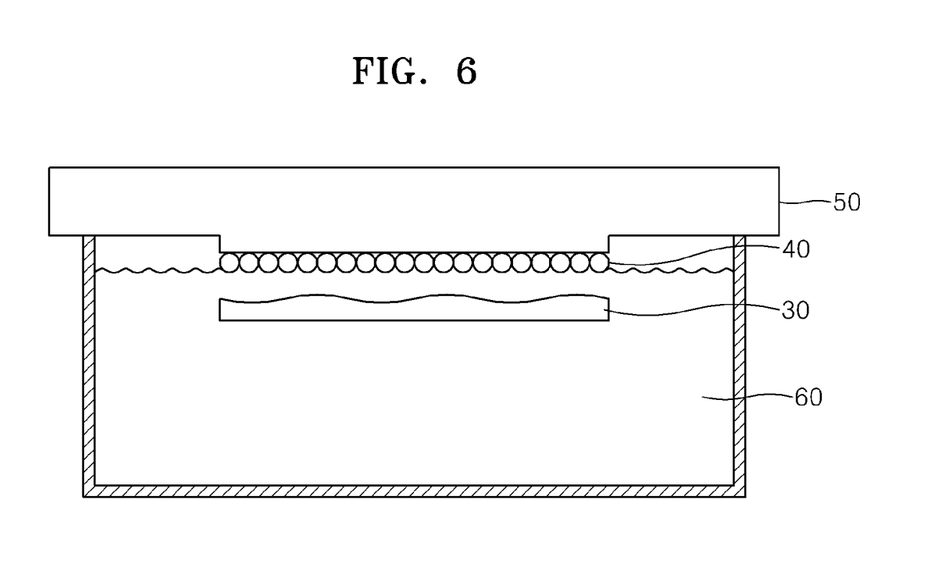

As illustrated in FIG. 6, the sacrificial layer 30 may be immersed in a polarizable solution 60 so as to remove the sacrificial layer 30 from the quantum dot layer 40. The sacrificial layer 30 may be a polymer-based material that may be easily generated/removed even at a low temperature, for example, in a range of from room temperature to 120 degrees Celsius, and may be formed from a material which is soluble in the polarizable solution 60 such as water. Accordingly, in certain embodiments, if the sacrificial layer 30 is immersed in the polarizable solution 60, the sacrificial layer 30 dissolves in the polarizable solution 60 after a predetermined period of time.

Figure 7:
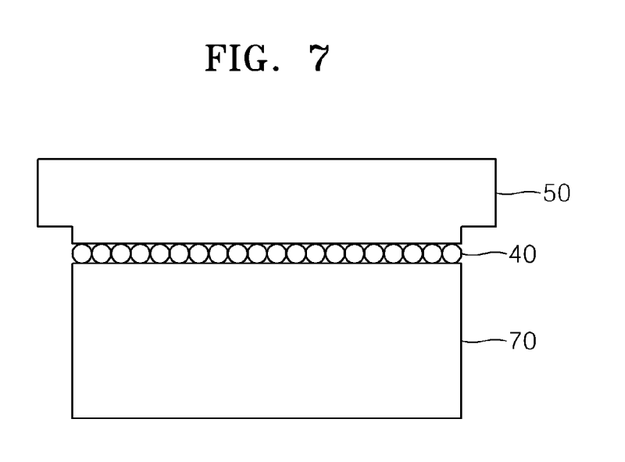

After the sacrificial layer 30 is removed, the quantum dot layer 40 may be transfer-printed on a device substrate 70. Then, as illustrated in FIG. 7, the quantum dot layer 40 may be formed on the device substrate 70. Although the device substrate 70 is illustrated as a single-layer in FIG. 7, the device substrate 70 may include any of variously stacked structures according to the type of a device in which the quantum dot layer 40 is used. For example, when the quantum dot layer 40 is used as an optoelectronic device, the device substrate 70 may have a structure in which a transparent electrode, a hole injection layer (HIL), a hole transport layer (HTL), etc. are stacked.

Meanwhile, when performing transfer-printing, heat in a temperature range of from about 30 degrees Celsius to about 200 degrees Celsius may be applied to the quantum dot layer 40. More preferably, heat in a temperature range of about 70 degrees Celsius, such that the quantum dot layer 40 picked up by the stamp 50 is perfectly transferred onto the device substrate 70.

Figure 8:
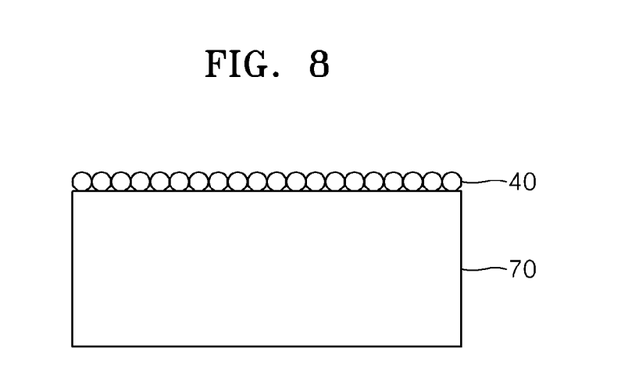

Then, as illustrated in FIG. 8, the stamp 50 is separated from the quantum dot layer 40. When the quantum dot layer 40 picked up by the stamp 50 is transfer-printed, a piezoelectric effect or micro-vibration such as acoustic waves, e.g. ultrasonic waves, may be applied so as to easily separate the quantum dots from the stamp 50. Also, the patterned stamp 50 is structuralized to form micro patterns of from about nano-scale to about several micron-scale in the stamp 50, thereby easily separating the quantum dots from the stamp 50 because of the small contact area therebetween. If micro patterns of from about nano-scale to about several micron-scale are formed in the stamp 50, a multi-layered organic structure including the quantum dot layer 40 or the entire device may be easily transferred onto another substrate because of a small contact area between the multi-layered organic structure or the entire device and the stamp 50.

As described above, if the sacrificial layer 30 is used, the quantum dot layer 40 may be easily manufactured. Also, if the sacrificial layer 30 is used, the characteristics of the quantum dot layer 40 may be maintained and the quantum dot layer 40 may be printed over a large area. In addition, if the sacrificial layer 30 is used, a quantum dot layer may be printed regardless of the thickness of the quantum dot layer, ranging from a monolayer to a multi-layer thickness.

Figure 9:
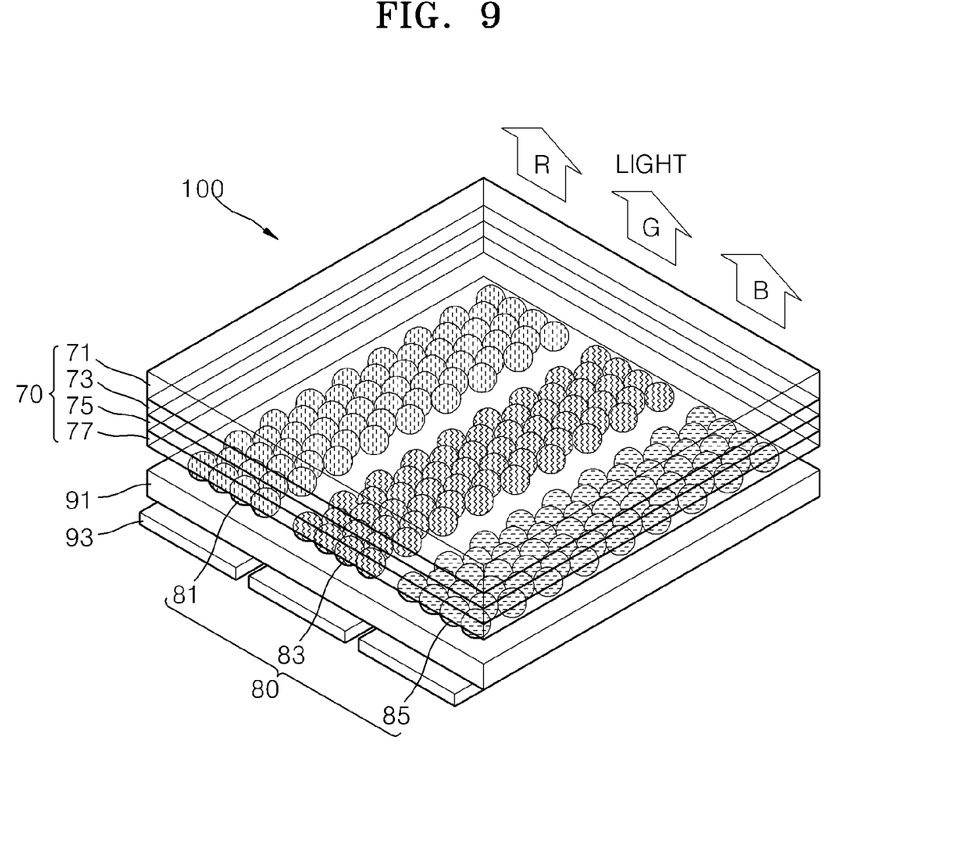

FIG. 9 is a view illustrating a quantum dot optoelectronic device 100 manufactured using a method of manufacturing a quantum dot layer, according to an embodiment of the present disclosure, wherein FIG. 9 shows a quantum dot display.

Referring to FIG. 9, the quantum dot optoelectronic device 100 includes a substrate 71, a quantum dot active layer 80 formed using the above-described method of manufacturing a quantum dot layer, a first electrode 73, e.g. an anode, and a second electrode 93, e.g. a cathode, that are connected to an external power source so as to inject carriers (charge carriers) to the quantum dot active layer 80, a first charge transport layer, e.g. a HTL 77, disposed between the quantum dot active layer 80 and the first electrode 73, and a second charge transport layer, e.g. an electron transport layer (ETL) 91 disposed between the quantum dot active layer 80 and the second electrode 93. The quantum dot optoelectronic device 100 may further include a HIL 75 between the first electrode 73 and the HTL 77 that are formed on the substrate 71.

The substrate 71 may be a transparent glass substrate or a flexible plastic substrate.

The first electrode 73 may serve as an anode and may be formed of a material having a high work function so as to allow holes to be injected into the first electrode 73. For example, the first electrode 73 may be formed of a transparent oxide such as indium tin oxide (ITO), indium oxide, or the like. The first electrode 73 may be formed on the substrate 71 through dry deposition such as sputtering.

The HTL 77 is disposed between the first electrode 73 and the quantum dot active layer 80. The HTL 77 may be formed of a p-type semiconductor polymer, for example, PEDOT, PSS, PPV, PVK, or the like. The HTL 77 may be formed using a wet coating method such as spin coating. For example, when a polymer layer formed of PPV is formed on the first electrode 73, a precursor solution including a PPV precursor polymer and a methanol organic solvent is spin-coated on the first electrode 73, and thermal treatment is performed thereon in an inactive gas atmosphere or in a vacuum at a curing temperature of from about 750 degrees Celsius to about 300 degrees Celsius for three hours, thereby obtaining a HTL 77 formed of a PPV thin film.

The quantum dot active layer 80 may be formed to realize a pixelized quantum dot display by transfer-printing quantum dot layers in which a plurality of colors are patterned, for example, quantum dot layers 81, 83, and 85 in which R, G, and B colors are patterned, onto the HTL 77 using the above-described method of manufacturing a quantum dot layer. Each quantum dot layer is a monolayer, and the plurality of quantum dot layers may be disposed spaced apart from one another. In this regard, a quantum dot may have a diameter of from about 1 nm to about 10 nm. A quantum dot may have a homogeneous single-layer structure or a double-layer structure of a core-shell. When a quantum dot has a double-layer structure of a core-shell, materials for forming a core and a shell may be different semiconductor compounds described above. However, an energy band gap of the material for forming the shell may be greater than that of the material for forming the core.

The ETL 91 is disposed between the quantum dot active layer 80 and the second electrode 93, that is, e.g., between cathodes, and may be formed of any of various materials. For example, the material for forming the ETL 91 may be a metallic oxide such as $TiO_2$, $ZrO_2$, $HfO_2$, or the like, an inorganic material including $Si_3N_4$, an n-type semiconductor polymer, or the like.

The second electrode 93 may serve as a cathode and may be formed of a material having a small work function so as to allow electrons to be easily injected into the ETL 91. The second electrode 93 may be formed of one metal selected from the group consisting magnesium (Mg), calcium (Ca), sodium (Na), potassium (K), titanium (Ti), indium (In), yttrium (y), lithium (Li), gadolinium (Gd), aluminum (Al), silver (Ag), tin (Sn), lead (Pb), cesium (Cs), and barium (Ba), or an alloy thereof, or may be formed of a material having a multi-layered structure, for example, LiF/Al, $LiO_2$/Al, LiF/Ca, LiF/Al, and $BaF_2$/Ca, but embodiments are not limited thereto. The second electrode 93 may be formed through dry deposition such as sputtering. The second electrode 93 may be patterned in correspondence to the quantum dot active layer 80 having an array of the quantum dot layers 81, 83, and 85 in which R, G, and B colors are patterned so as to realize a pixelized quantum dot display.

The HIL 75 may be disposed between the first electrode 73 and the HTL 77, and the material for forming the HIL 75 is not particularly limited. Any material having an excellent interfacial characteristic and capable of easily transmitting electrons to an electrode may be used to form the HIL 75. For example, the HIL 75 may be formed of a material including poly(3,4-ethylenedioxythiophene) (PEDOT).

In FIG. 9, a structure in which the first electrode 73, the HIL 75, the HTL 77, and the quantum dot active layer 80 are stacked on the substrate 71 is coupled to a structure in which the second electrode 93 and the ETL 91 are stacked, and light of R, G, and B colors are emitted through the substrate 71. However, this is just an example, and a quantum dot solar cell or a stacked structure of the quantum dot optoelectronic device 100 is not limited thereto. For example, in the quantum dot solar cell or a quantum dot display, an ETL and a second electrode may be formed on a structure in which a first electrode, a HIL, a HTL, and a quantum dot active layer are stacked on a substrate, and solar light incident toward the second electrode may be absorbed into the quantum dot active layer or light of R, G, and B colors may exit.

If a voltage is applied to the quantum dot optoelectronic device 100 through the first and second electrodes 73 and 93 to form an electric field, holes and electrons injected from the first and second electrodes 73 and 93 pass through the HTL 77 and the ETL 91 and are recombined inside the quantum dot active layer 80 to form electron-hole pairs which are excitons, and the excitons enter an electrical ground state due to radiative decay, thereby emitting light to the outside. In this regard, light of R, G, and B colors is emitted according to whether the first and second electrodes 73 and 93 are recombined in R, G, and B zones of the quantum dot layers 81, 83, and 85 in which R, G, and B colors are patterned. Light of one of the R, G, and B colors may be selectively emitted or light of each of the R, G, and B colors may be simultaneously emitted by differentiating their light intensities under control of a driving unit (not shown) so as to configure pixels of various colors.

Figure 10:
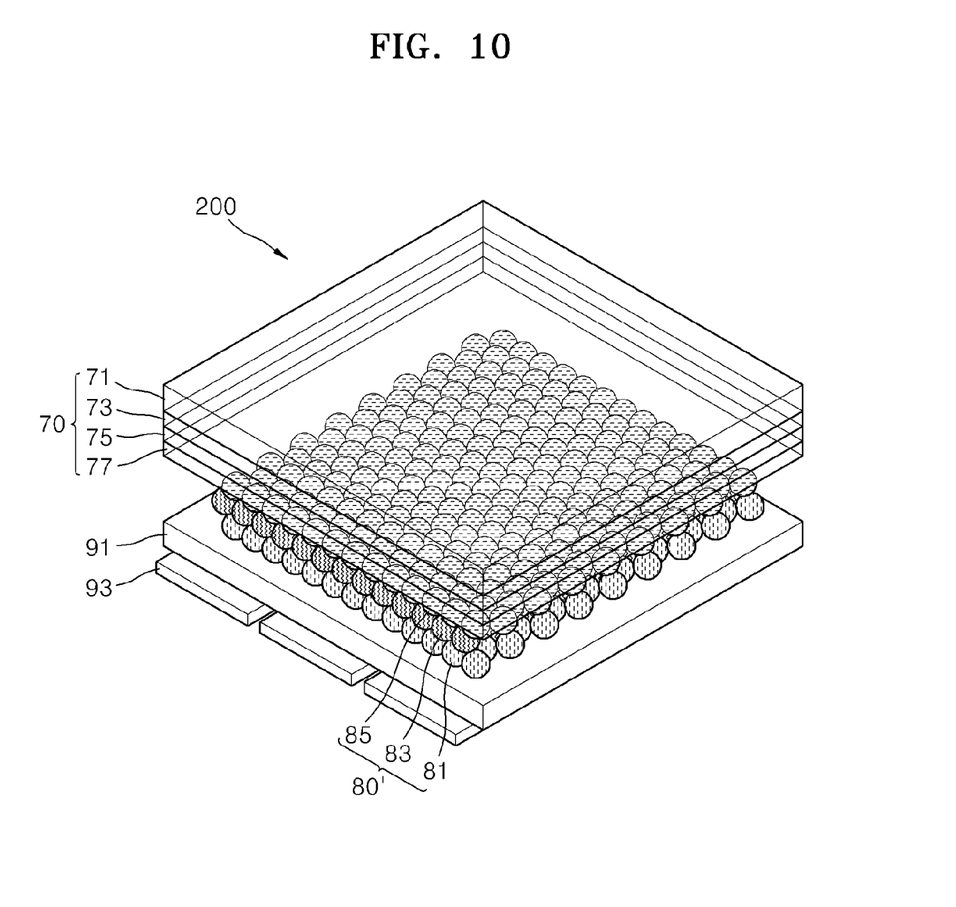

According to the above-described method of manufacturing a quantum dot layer, instead of forming the quantum dot layers 81, 83, and 85 in which R, G, and B colors are patterned, R, G, and B quantum dot layers may be transfer-printed to be configured as a multi-layer as illustrated in FIG. 10, thereby realizing an optoelectronic device such as a quantum dot (QD) solar cell or a quantum dot light-emitting device (QD-LED).

FIG. 10 is a view illustrating a quantum dot optoelectronic device 200 manufactured using a method of manufacturing a quantum dot layer, according to another embodiment of the present disclosure. With the exception that quantum dot active layer 80' is formed as a multi-layer including a plurality color quantum dot layers, for example, R, G, and B quantum dot layers 81, 83, and 85 and the quantum dot active layer 80' is not pixelized, the basic stacked structure, material of each layer, and activation principle of the quantum dot optoelectronic device 200 illustrated in FIG. 10 are the same as those of the quantum dot optoelectronic device 100 illustrated in FIG. 9. Thus, in FIG. 10, the same reference numerals as in FIG. 9 represent elements having substantially the same functions, and a duplicative description of the elements described with respect to FIG. 9 is not repeated here.

In general, as per the methods previously used, because a quantum dot is manufactured through a solution process, the quantum dot may not be manufactured as a thin multi-layer. However, using the method of manufacturing a quantum dot layer according to the embodiment, a sacrificial layer and R, G, and B quantum dot layers may be printed in a multi-layered structure on a device through transfer-printing and light of R, G, and B colors may be simultaneously emitted, thereby inducing white light-emission. Also, white balance may be easily controlled using the thickness of each quantum dot layer and partial energy transfer between the quantum dot layers. As illustrated in FIG. 10, in a device using a quantum dot multi-layer, for example, in a white emission quantum dot device, carriers may sequentially cross unique energy barriers of the quantum dots of each quantum dot layer according to an order in which the quantum dot layers having various energy bands are disposed, thereby remarkably decreasing a threshold voltage and a driving voltage.

As such, if a quantum dot emission layer having a multi-layered structure manufactured using the presently disclosed method of manufacturing a quantum dot layer is used to manufacture a white emission quantum dot device, white light may be controlled by partial energy transfer between quantum dot active layers and by controlling the thickness of each quantum dot active layer, thereby decreasing the driving voltage and increasing emission efficiency. Also, if the quantum dot active layer having a multi-layered structure is used to manufacture a solar device, each quantum dot active layer absorbs light of various wavelengths so as to rapidly move generated and separated electrons and holes toward an electrode according to a gradational energy band structure, thereby increasing the light absorption and efficiency of a solar cell.

In another embodiment, there is a method of transferring a first quantum dot layer from one substrate to another, the method comprising: (a) sequentially stacking a self-assembled monolayer (SAM), a sacrificial layer, and a first quantum dot layer on a first substrate; (b) contacting a stamp with the first quantum dot layer; (c) removing the sacrificial layer from the first quantum dot layer; and (d) depositing the first quantum dot layer on a second substrate. These steps may be performed as described above.

With respect to removing the sacrificial layer in this embodiment, a solution that dissolves the sacrificial layer may be used, and the step of removing the sacrificial layer is preferably performed prior to the step of depositing the first quantum dot layer on the second substrate. In addition, in this embodiment, it is preferable that following the sequential stacking step, the amount of adhesion between the SAM and the sacrificial layer is less than the amount of adhesion between the sacrificial layer and the first quantum dot layer. It is further preferable that following the step of contacting a stamp with the first quantum dot layer, the amount of adhesion between the first quantum dot layer and the stamp is greater than the amount of adhesion between the SAM and the sacrificial layer. This permits a single multilayer structure including the sacrificial layer, the first quantum dot layer, and the stamp (but not the SAM) to be removed during the step of removing the sacrificial layer, the first quantum dot layer, and the stamp. In another embodiment, the surface of the second substrate to be contacted with the first quantum dot layer comprises a second quantum dot layer.

Hereinafter, the performance of a quantum dot layer manufactured using the method according to the present disclosure will be described.

During the manufacturing of the quantum dot layer, the absorbance of the quantum dot layer is measured in order to check whether a loss of a characteristic of the quantum dot layer has occurred. For example, the absorbance of a quantum dot layer before and after the quantum dot layer is transferred onto a device substrate is measured, wherein the quantum dot layer has a thickness of 7 nm and includes a quantum dot solution of 0.23 wt %.

Figure 11:
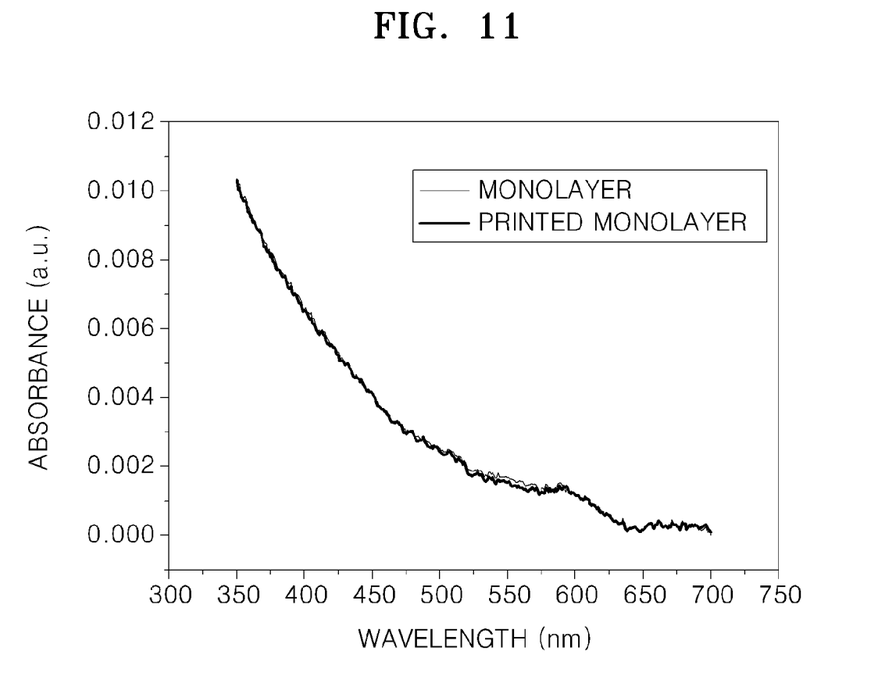
FIG. 11 is a graph showing a result of measurement of the absorbance of a quantum dot layer before and after being transferred, according to an embodiment.

FIG. 11 is a graph showing a result of the measurement of the absorbance of a quantum dot layer before and after being transferred, according to an embodiment of the present invention. As illustrated in FIG. 11, the absorbance of the quantum dot layer before being transferred, that is, the absorbance of the quantum dot layer formed on a sacrificial layer, is almost the same as the absorbance of the quantum dot layer after being transferred, that is, the absorbance of the quantum dot layer formed on a device substrate. Accordingly, FIG. 11 illustrates that the absorbance of the quantum dot layer is not influenced by the sacrificial layer.

Figure 12:
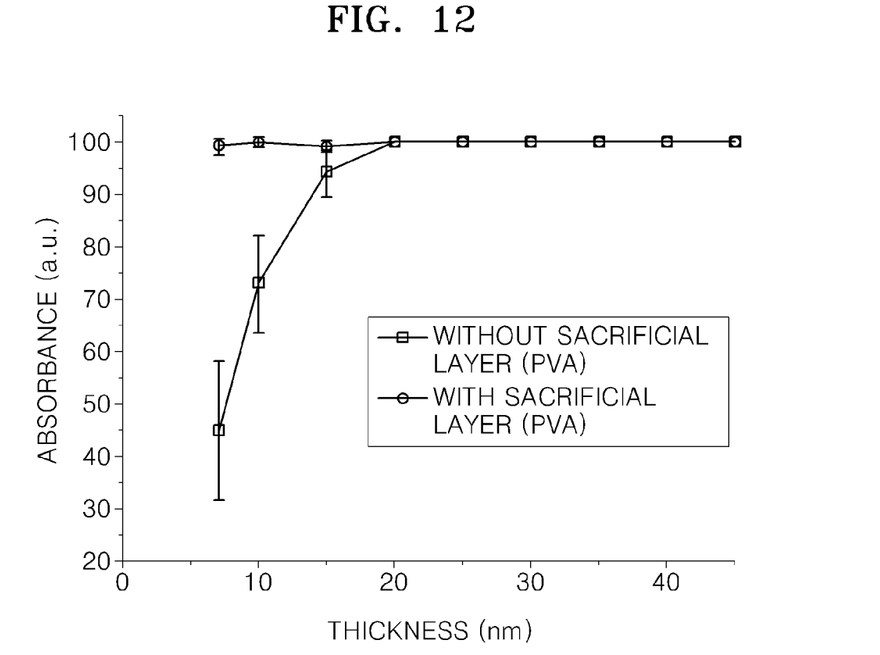
FIG. 12 is a graph showing a result of measurement of a pick-up yield of a quantum dot layer according to whether a sacrificial layer is used, according to an embodiment.

FIG. 12 is a graph showing a result of the measurement of the pick-up yield of a quantum dot layer according to whether a sacrificial layer is used. When a stamp picks up the quantum dot layer without using the sacrificial layer, the pick-up yield of the quantum dot layer having a thickness of less than 20 nm is remarkably decreased. However, when the stamp picks up the quantum dot layer formed on the sacrificial layer, the pick-up yield of the quantum dot layer having a thickness of less than 20 nm is high.

Figure 13:
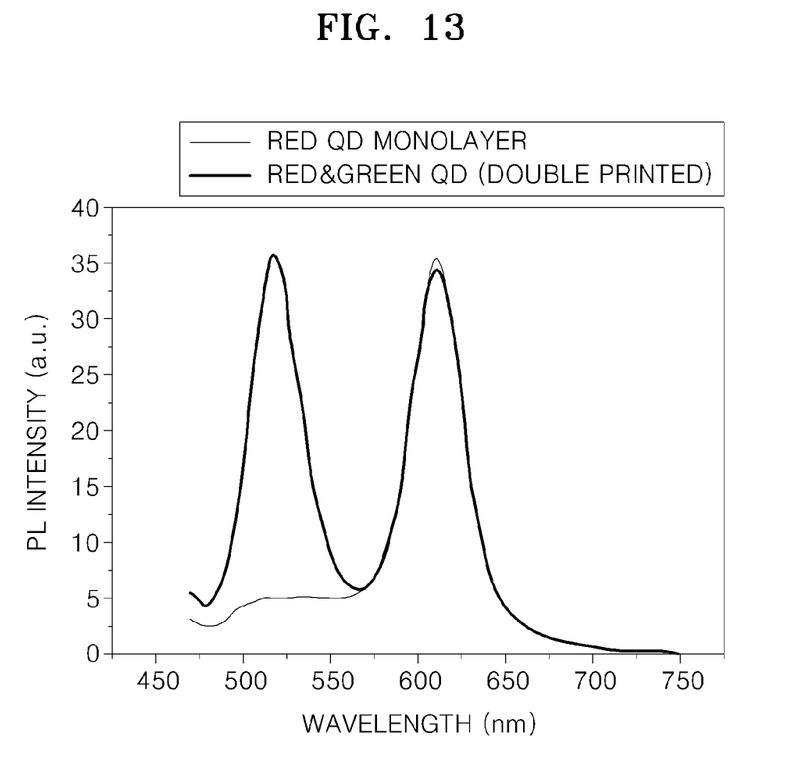
FIG. 13 is a graph showing a result of measurement of the photoluminescence (PL) intensities of a quantum dot layer having a single-layer structure and a quantum dot layer emitting a plurality of colors and having a multi-layered structure, according to an embodiment.

FIG. 13 is a graph showing a result of the measurement of the photoluminescence (PL) intensities of a quantum dot layer having a single-layer structure and a quantum dot layer emitting a plurality of colors and having a multi-layered structure. Referring to FIG. 13, the PL intensity when the quantum dot layer emits red light is the same as the PL intensity when the quantum dot layer having a multi-layered structure emits red and green light. Accordingly, FIG. 13 illustrates that even though the quantum dot layer has a multi-layered structure, a loss of the quantum dot layer does not occur during transfer-printing.

According to the method of manufacturing a quantum dot layer, the quantum dot layer may be formed and transfer-printed using a sacrificial layer.

If the quantum dot layer is transferred using the sacrificial layer, the initial state of the quantum dot layer may be maintained without causing a loss of a characteristic of the quantum dot layer. Also, the quantum dot layer may be configured as a multi-layered structure by repeatedly printing the quantum dot layer using the sacrificial layer, and also an optoelectronic device such as a large area solar device or an emission device may be easily manufactured.

In addition, if the sacrificial layer is used, the quantum dot layer may have a high pick-up yield regardless of the thickness of the quantum dot layer, and thus quantum dot layers having various thicknesses may be transferred.

Furthermore, a stamp picks up quantum dots cast on a source substrate to transfer-print the quantum dots onto a device substrate, and thus a quantum dot layer may be patterned to be a color pixel or quantum dot layers having various colors may be stacked in a multi-layered structure.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A method of manufacturing a quantum dot layer, the method comprising:
   sequentially stacking a self-assembled monolayer (SAM), a sacrificial layer, and a quantum dot layer on a source substrate;
   disposing a stamp on the quantum dot layer;
   picking up the sacrificial layer, the quantum dot layer, and the stamp; and
   removing the sacrificial layer from the quantum dot layer using a solution that dissolves the sacrificial layer.

2. The method of claim 1, wherein the quantum dot layer is formed on the sacrificial layer through a solution process.

3. The method of claim 1, wherein the sacrificial layer is a polymer-based high molecular weight material.

4. The method of claim 1, wherein the solution is a polarizable solution.

5. The method of claim 1, wherein the quantum dot layer comprises a plurality of quantum dots arranged in a two-dimensional array.

6. The method of claim 1, wherein when the sacrificial layer, the quantum dot layer, and the stamp are picked up, the sacrificial layer is separated from the SAM.

7. The method of claim 1, wherein the stamp is an elastomeric polymer.

8. The method of claim 1, further comprising performing an ultra-violet (UV)-ozone treatment on the stamp.

9. The method of claim 1, wherein a surface of the stamp that contacts the quantum dot layer comprises micro patterns that decrease a contact area between the quantum dot layer and the stamp.

10. The method of claim 1, further comprising forming the quantum dot layer on the device substrate by transfer-printing the quantum dot layer from which the sacrificial layer is removed onto a device substrate.

11. The method of claim 10, further comprising separating the stamp from the quantum dot layer using at least one of heat, a piezoelectric effect, and micro-vibration.

12. A quantum dot optoelectronic device comprising:
a first electrode;
a second electrode that is disposed spaced apart from the first electrode; and
a quantum dot active layer disposed between the first electrode and the second electrode, the quantum dot active layer comprising a quantum dot layer manufactured using the method of claim 1.

13. The quantum dot optoelectronic device of claim 12, wherein the quantum dot layer comprises a plurality of quantum dots each having a size configured to emit light of a same wavelength band.

14. The quantum dot optoelectronic device of claim 12, wherein the quantum dot active layer comprises a plurality of quantum dot layers emitting light of different colors.

15. The quantum dot optoelectronic device of claim 14, wherein the quantum dot active layer has a multi-layered structure in which a plurality of quantum dot layers are vertically stacked.

16. The quantum dot optoelectronic device of claim 15, wherein the quantum dot active layer emits white light.

17. The quantum dot optoelectronic device of claim 14, wherein the quantum dot active layer has a single-layer structure in which the plurality of active layers are horizontally disposed.

18. The quantum dot optoelectronic device of claim 17, wherein the plurality of quantum dot layers are disposed spaced apart from one another.

19. A method of transferring a first quantum dot layer from one substrate to another, the method comprising:
(a) sequentially stacking a self-assembled monolayer (SAM), a sacrificial layer, and a first quantum dot layer on a first substrate;
(b) contacting a stamp with the first quantum dot layer;
(c) removing the sacrificial layer from the first quantum dot layer; and
(d) depositing the first quantum dot layer on a second substrate.

20. The method of claim 19, further comprising the removing the sacrificial layer from the first quantum dot layer using a solution that dissolves the sacrificial layer.

21. The method of claim 19, wherein following the sequential stacking, an amount of adhesion between the SAM and the sacrificial layer is less than an amount of adhesion between the sacrificial layer and the first quantum dot layer.

22. The method of claim 21, wherein following the contacting the stamp with the first quantum dot layer, an amount of adhesion between the first quantum dot layer and the stamp is greater than the amount of adhesion between the SAM and the sacrificial layer.

23. The method of claim 19, wherein a thickness of the first quantum dot layer is less than about 20 nm.

24. The method of claim 19, wherein a surface of the second substrate to be contacted with the first quantum dot layer comprises a second quantum dot layer.

* * * * *